US007928398B2

(12) United States Patent
Du et al.

(10) Patent No.: US 7,928,398 B2
(45) Date of Patent: Apr. 19, 2011

(54) RADIATION DETECTING PIXEL ARRAY SIGNAL ROUTING

(75) Inventors: Yanfeng Du, Rexford, NY (US); Naresh Kesavan Rao, Clifton Park, NY (US)

(73) Assignee: Morpho Detection, Inc., Newark, CA (US)

( * ) Notice: Subject to any disclaimer, the term of this patent is extended or adjusted under 35 U.S.C. 154(b) by 427 days.

(21) Appl. No.: 12/335,636

(22) Filed: Dec. 16, 2008

(65) Prior Publication Data

US 2010/0148082 A1    Jun. 17, 2010

(51) Int. Cl.
*G01T 1/24* (2006.01)
(52) U.S. Cl. .................................. 250/370.08
(58) Field of Classification Search ............. 250/370.08, 250/370.09; 378/98.8
See application file for complete search history.

(56) References Cited

U.S. PATENT DOCUMENTS

2001/0016029 A1* 8/2001 Tumer .......................... 378/98.8
2004/0217294 A1* 11/2004 Zur ........................... 250/370.09

* cited by examiner

*Primary Examiner* — David P Porta
*Assistant Examiner* — Mark R Gaworecki
(74) *Attorney, Agent, or Firm* — Armstrong Teasdale LLP

(57) ABSTRACT

An embodiment of the invention includes a radiation detecting pixel array. The radiation detecting pixel array includes a substrate, a plurality of radiation detecting pixels arranged in a grid pattern on the substrate, a signal routing array embedded within the substrate in operative communication with the plurality of radiation detecting pixels, and at least two symmetrical communication channels arranged on each of two sides of the grid pattern. The signal routing array is formed of communication channels configured to provide operative communication between any of the plurality of radiation detecting pixels and each of the at least two symmetrical communication channels.

19 Claims, 5 Drawing Sheets

RADIATION DETECTING PIXEL ARRAY SIGNAL ROUTING

CROSS REFERENCE TO RELATED APPLICATIONS

The U.S. Government may have certain rights in this invention pursuant to contract number HSHQDC-06-C-00089 awarded by the Domestic Nuclear Detection Office (DNDO), Department of Homeland Security, Washington D.C.

BACKGROUND OF THE INVENTION

Embodiments of the invention generally relate to radiation detection, and more particularly radiation detection pixel signal routing to reduce system dead time.

Generally, optoelectronic devices convert optical energy into electrical energy. In some applications, this energy, or radiation, is detected using an array of optoelectronic sensors dispersed over the surface of a detection device. Signals from individual "pixels," or detectors, are routed to analog-to-digital converters (ADC) of the detection device. The digital signals are subsequently processed, for example with a processor, to determine suitable information from incident radiation.

Generally, in a multiple pixel detector configuration, in order to achieve the best signal to noise ratio, each pixel requires its own preamplifier, shaping amplifier, peak/hold circuit, and other analog components. But in order to reduce the overall power consumption and the processor chip size, it is not necessary/desired to have one ADC for each channel. Different types of multiplex schemes are usually used to share one ADC by multiple channels. In the event that there are multiple pixels that have signal amplitude above a trigger threshold, the ADC has to digitize the signals from these pixels one by one. Thus the dead time from the ADC will increase linearly as the number of the triggered pixels increase.

Thus, example embodiments of the present invention provide novel signal routing schemes and radiation detection apparatuses which overcome these drawbacks.

BRIEF DESCRIPTION OF THE INVENTION

An embodiment of the invention includes a radiation detecting pixel array. The radiation detecting pixel array includes a substrate, a plurality of radiation detecting pixels arranged in a grid pattern on the substrate, a signal routing array embedded within the substrate in operative communication with the plurality of radiation detecting pixels, and at least two symmetrical communication channels arranged on each of two sides of the grid pattern. The signal routing array is formed of communication channels configured to provide operative communication between any of the plurality of radiation detecting pixels and each of the at least two symmetrical communication channels.

Another embodiment of the invention includes a radiation detecting apparatus. The radiation detecting apparatus includes a radiation detecting pixel array, a radiation detector module in operative communication with the radiation detecting pixel array through at least two symmetrical communication channels, and an output device in operative communication with the radiation detector module. The at least two symmetrical communications channels are arranged on each of two sides of the radiation detecting pixel array, and the at least two symmetrical communication channels are configured to provide anode pixel signals from any pixel of the radiation detecting pixel array to the radiation detector module.

BRIEF DESCRIPTION OF THE DRAWINGS

These and other features, aspects, and advantages of the present invention will become better understood as the following detailed description is read with reference to the accompanying drawings in which like reference numerals represent like elements throughout the drawings, wherein.

DETAILED DESCRIPTION OF THE INVENTION

Figure 1:
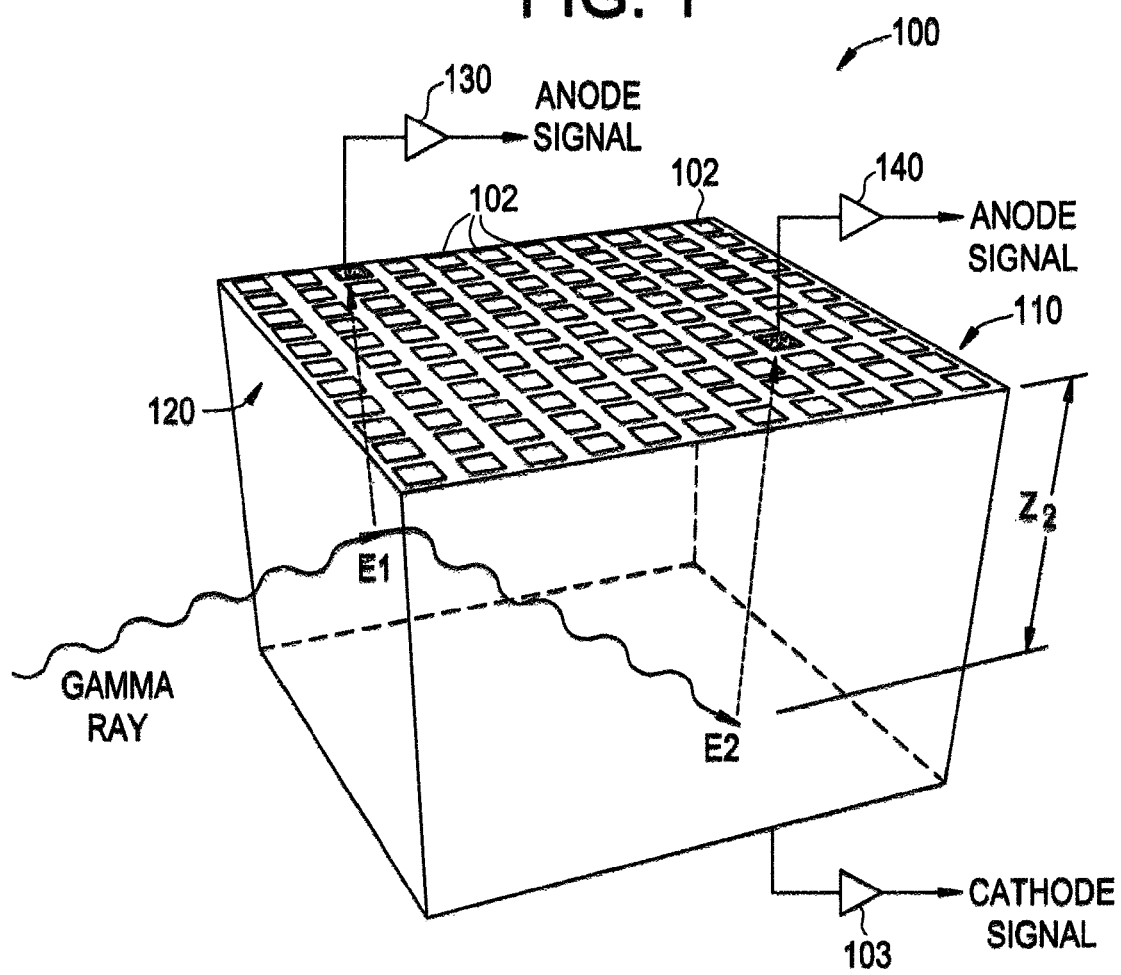
FIG. 1 illustrates an example radiation detection apparatus, according to an example embodiment.

Detailed illustrative embodiments are disclosed herein. However, specific functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments.

It will be understood that, although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting of example embodiments.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Hereinafter, example embodiments of the present invention will be described in detail. According to example embodiments, radiation detection apparatuses including novel checkerboard routing schemes are disclosed. The detection apparatuses may be apparatuses configured to provide the direction, flux, energy, and isotope of detected radiation. Furthermore, the detection apparatuses may be configured to provide the position of detected radiation within a pixel array of the apparatus, and may be configured to correct detection information altered through charge trapping and/or material non-uniformity. The detection apparatuses may include ASIC processing architecture including a plurality of ADCs for processing signals from a pixel array including symmetrical signal routing schemes. The symmetrical signal routing schemes may include a novel checkerboard signal routing scheme with symmetrical signal detection arrangements in operative communication with the pixel array.

In order to reduce the system dead time without increasing the number of the ADCs, the checkerboard signal routing configuration connects neighboring pixels of the pixel array to different locations on the readout ASIC architecture. By distributing the loads for the ADCs evenly, sets of the ADCs from different locations may be used to digitize the signals from the same radiation interaction. Thus the overall dead time may be reduced.

FIG. 1 illustrates an example radiation detection apparatus, according to an example embodiment. The apparatus 100 may include a pixellated detection array 110 arranged on a semiconductor substrate 120. The semiconductor substrate 120 may be comprised of a suitable semiconductor material, for example, CZT (Cadmium zinc telluride), CdTe (Cadmium telluride), or $HgI_2$ (mercuric iodide). It is understood that these materials are examples only and are in no way exhaustive, therefore example embodiments should not be limited to only these examples. The pixellated detection array 110 may include a plurality of pixels 102. The apparatus may be configured such that anode signals 130, 140 from the plurality of pixels 102 are provided from one surface of the substrate 120 and cathode signals 103 are provided from another surface of the substrate 120.

For example, upon interaction of gamma radiation E1, E2, anode pixel signal 130, 140 may be generated. Furthermore, upon interaction of gamma radiation E1, E2, cathode signal 103 may be generated. Using the position of the pixels generating anode signals 130 and 140, along with the cathode signal 103, the direction and other suitable information relating to incident gamma radiation E1, E2 may be calculated. For example, a processor or other computing portion may calculate information associated with the incident gamma radiation. Hereinafter, a more detailed discussion of an example detection apparatus including a computer processor is provided.

Figure 2:
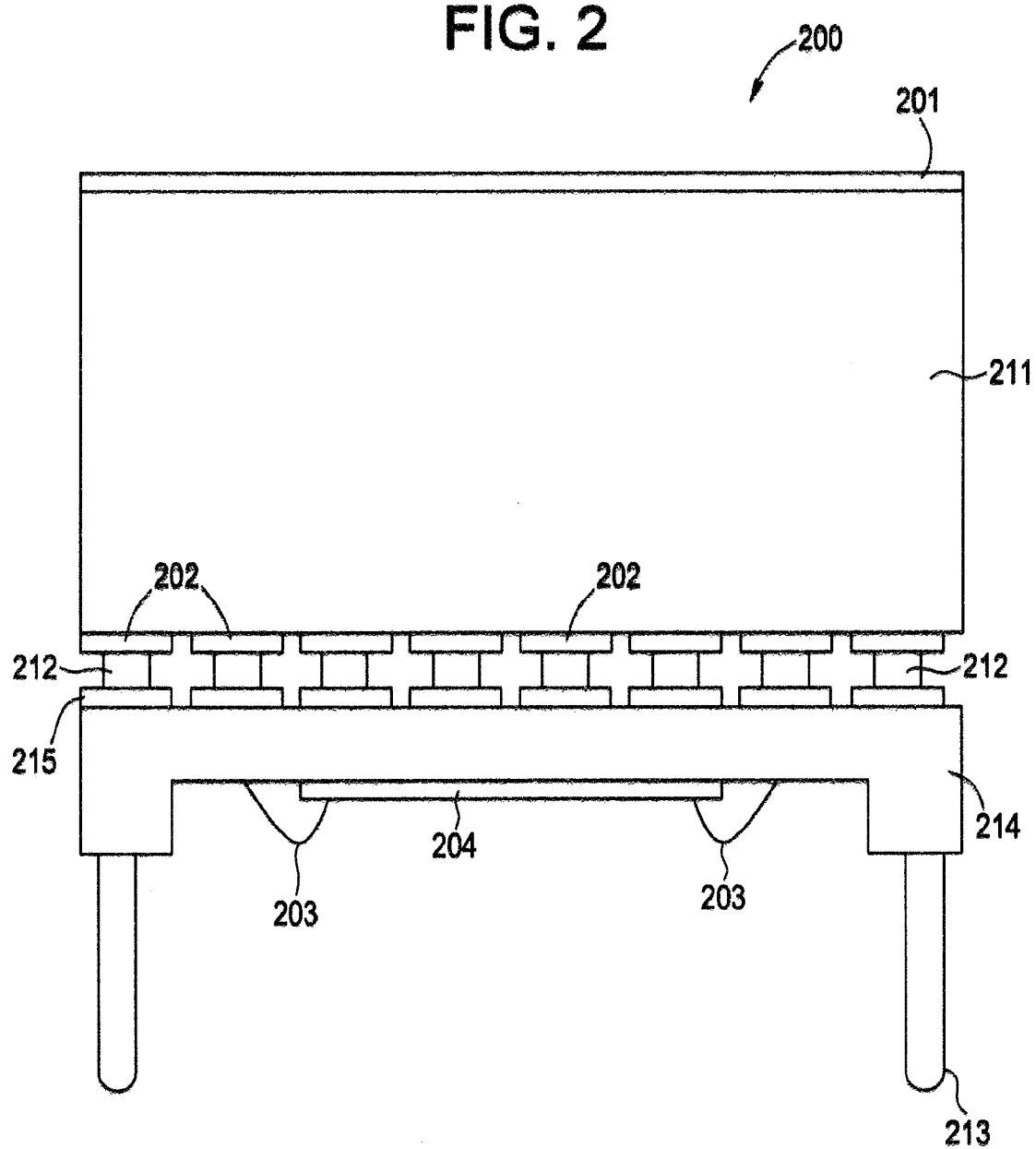
FIG. 2 illustrates an example radiation detection apparatus, according to an example embodiment.

FIG. 2 illustrates an example radiation detection apparatus, according to an example embodiment. The apparatus 200 may include a cathode surface 201, a semiconductor detector 211, and a pixellated detection array including a plurality of pixel electrodes 202. Each of the plurality of pixels may be operatively connected to a packaging or module substrate 214 through conductive material 212. The packaging substrate 214 may include connector pins 213 for connection or communication with other devices or mechanical support. The conductive material 212 may be solder, epoxy, or any other suitable conductive material. Furthermore, the packaging substrate 214 may be comprised of ceramic, plastic, or any other suitable insulator, for example, Teflon®. Each portion of conductive material 212 may be operatively connected to an associated trace 215. Each trace 215 may be associated with a pixel 202 of the plurality of pixels in the pixellated array.

The apparatus 200 further includes a readout processor or other computing device 204 (e.g., ASIC device). Furthermore, the computing device 204 may be in communication with pixels 202 through conductive bonds 203. For example, conductive bonds 203 may be wire bonds or other suitable connections. Therefore, if radiation is incident upon a pixel(s) of the apparatus 200, the computing device 204 may interpret information provided by the pixel(s) to discern appropriate information regarding the radiation. For example, if a checkerboard signal routing scheme is employed as described herein, anode signals from pixels 202 may be routed to different side of the computing device 204. The anode signals may be processed, and appropriate information may be interpreted. The interpreted information may be output, for example, through connector pins 213. Hereinafter, a more detailed discussion of a checkerboard signal routing scheme and a symmetrical layout of associated signal paths is described with reference to FIGS. 3-4.

Figure 3:
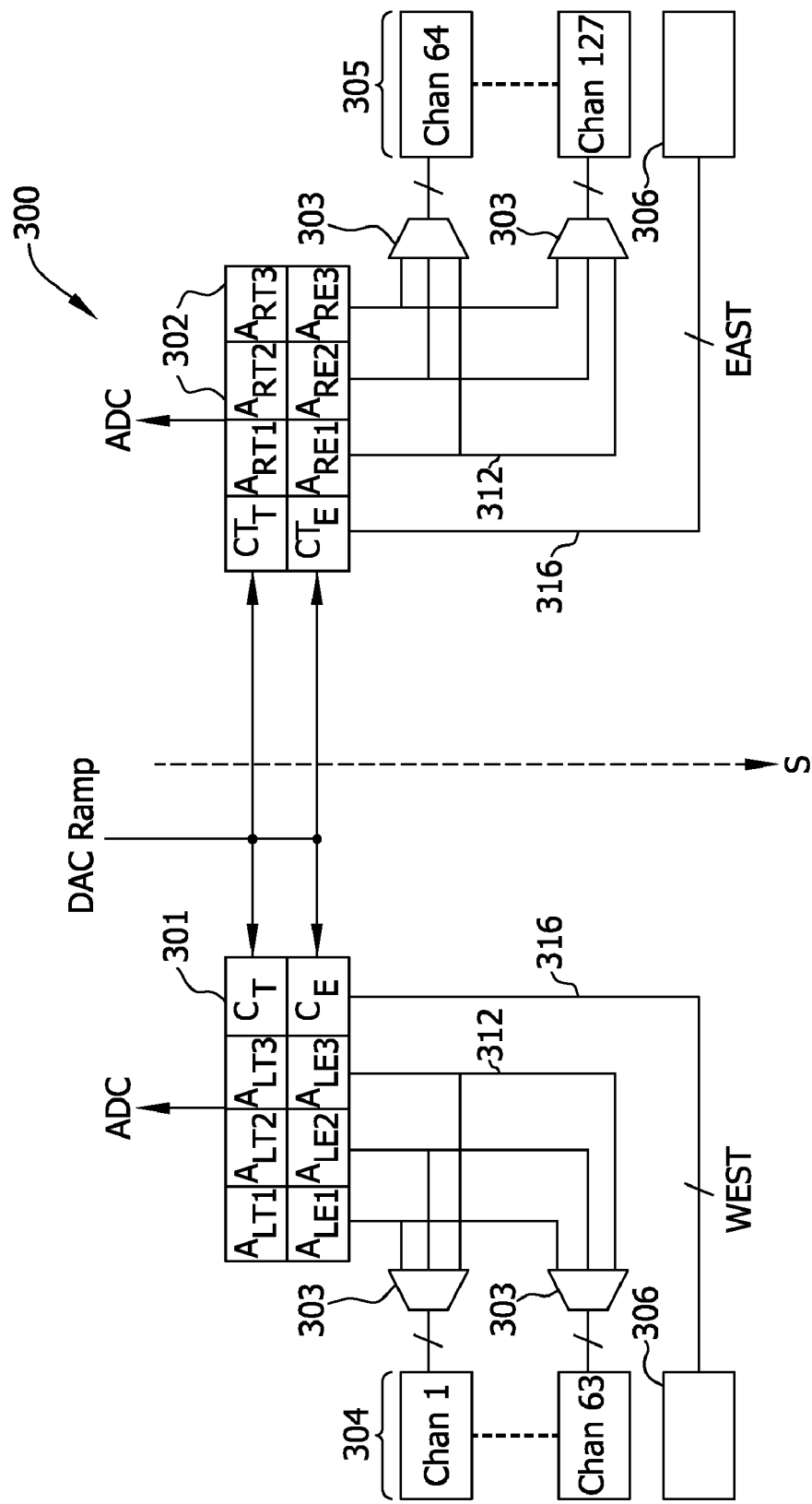
FIG. 3 illustrates a schematic of a signal routing scheme within an example radiation detection apparatus, according to an example embodiment.

The readout processor 204 includes some analog signal processing part and digital signal processing part for each channel. FIG. 3 illustrates a schematic of an Analog to Digital Conversion (ADC) architecture of the readout ASIC 204. In order to reduce the ASIC power consumption and the overall ASIC size, each readout channel does not have its own ADC. As illustrated, all anode channels are arranged symmetrically into two groups: 304 and 305. All channels in the west group 304 share three common ADCs 301 through the multiplexer 303. Similarly, all channels on the east side group 305 share three common ADCs through the multiplexer 302. Under such an ADC architecture, any gamma interaction that has less than four trigger pixels within the same readout group can be processed simultaneously. For interactions that have more than three trigger pixel, a second readout cycle have to the performed.

Figure 4:
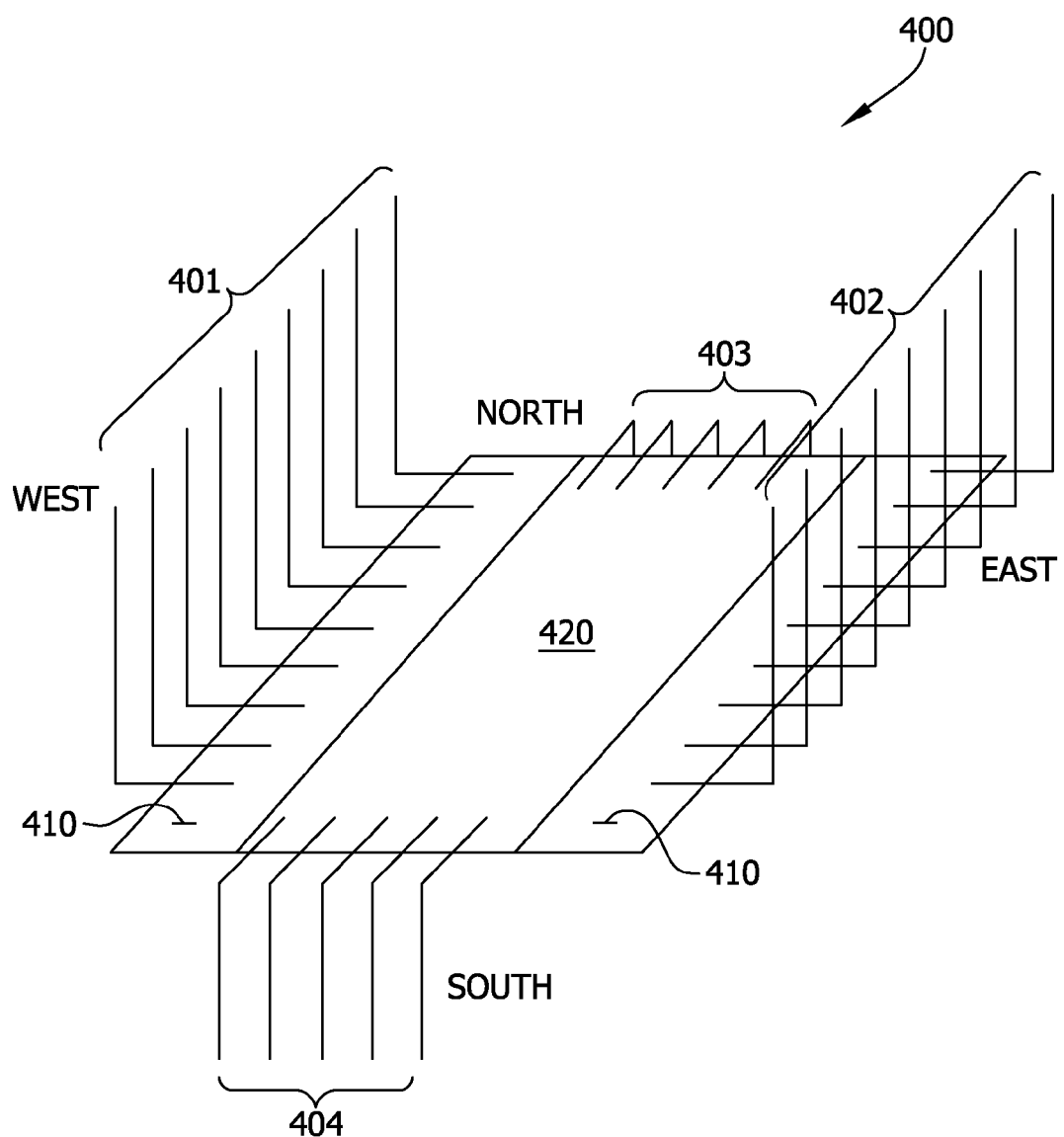
FIG. 4 illustrates an overview of signal routing connections within an example radiation detection apparatus, according to an example embodiment.

FIG. 4 illustrates an overview of signal routing connections within an example radiation detection apparatus, according to an example embodiment. As illustrated, the apparatus 400 may include anode signal channels 401 and 402 arranged on a West and an East side of the apparatus. Furthermore, the anode signal channels 401 and 402 may be in operative communication with analog processing portions 410 of the apparatus 400. As further illustrated, the apparatus 400 includes digital signal channels 403 and 404 arranged on North and South side of the apparatus. The digital signal paths 403 and 404 may be in operative communication with a digital processing portion 420 of the apparatus 400. For example, the analog processing portions 410 and the digital processing portion 420 may be included on a computing device as described above. Furthermore, the anode signal channels 401 an d402 may be in operative communication with anode pixels of a pixellated detection array as described above. Hereinafter, a checkerboard pixel arrangement is described more fully with reference to FIG. 5.

Figure 5:
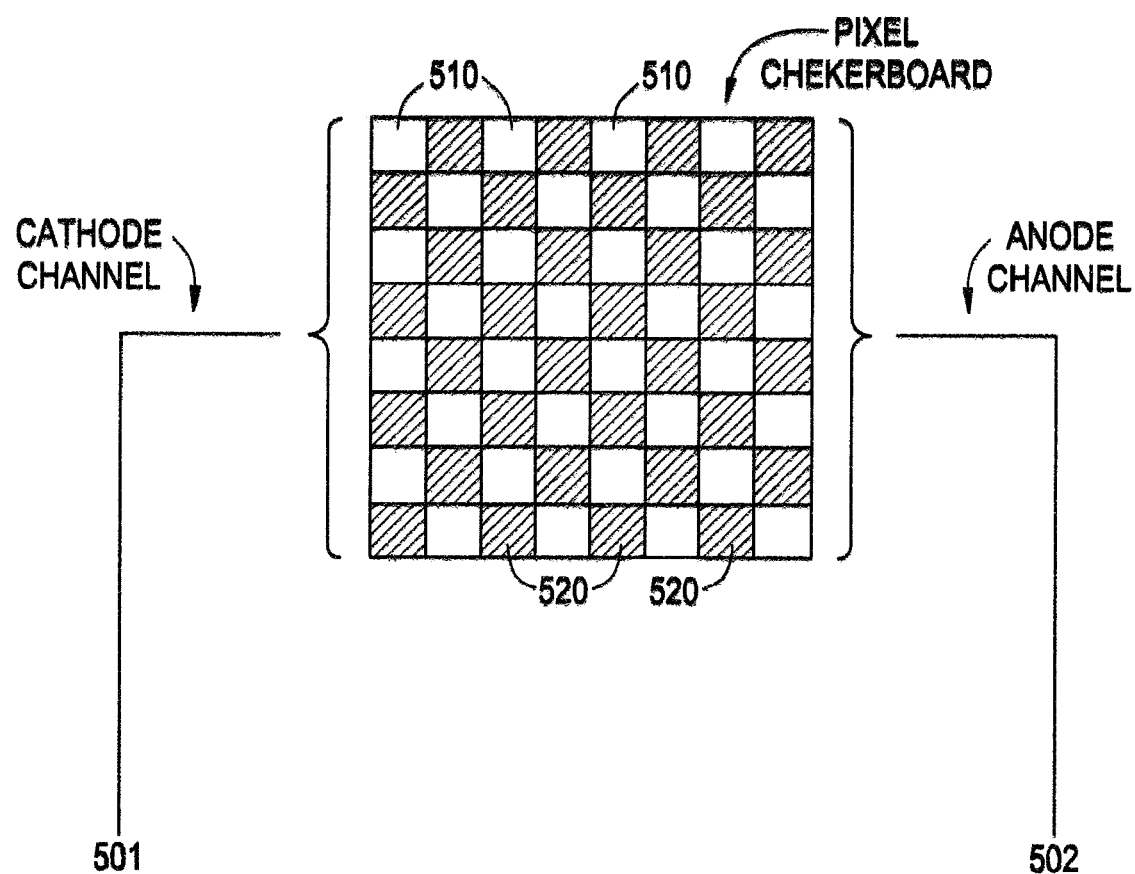
FIG. 5 illustrates a checkerboard pixel arrangement, according to an example embodiment.

FIG. 5 illustrates a checkerboard signal route schematic between radiation detector 211 and the readout ASIC 204 in FIG. 2. As illustrated, a plurality of pixels of the radiation detector are divided into two groups. For group 501 (pixels with darker contrast in FIG. 5), their signals are routed to the west side 401 (e.g., see 401 in FIG. 4). For group 502 (pixels with white color in FIG. 5), their signals are routed to the east side 402. The checkerboard signal routing may be facilitated through the module substrate 214.

The primary physical processes that cause multiple pixel triggering from one gamma ray are charge sharing and gamma scattering. The probability distribution for these processes decreases rapidly as a function of distance. For example, if the initial gamma interaction occurs near a corner of four pixels, the charge carrier may be shared and collected by the four nearby pixels, which leads to four pixel triggering. By utilizing this probability distribution, the ADC readout cycles may be reduced by using the checkerboard substrate routing illustrated in FIG. 5. More clearly, instead of routing one half of anode pixels to one side of the readout ASIC, neighboring pixels are routed to a different side of the readout ASIC, thus the neighboring pixels may be handled by different ADCs relatively simultaneously. Therefore the overall system dead time may be reduced without the need for additional ADCs. As the gamma energy increases, the probability for more than four pixel triggering events will increase, and thus, the benefits of the checkerboard signal routing scheme will also increase.

Therefore, as described above, example embodiments provide radiation detection apparatuses with a checkerboard signal routing scheme to reduce system dead time and ADC read cycles. The radiation detection apparatuses may be apparatuses configured to provide the direction, flux, energy, and isotope of detected radiation. The detected radiation may be gamma radiation or any other form of radiation chosen or desired to be detected.

With only some example embodiments of the present invention having thus been described, it will be obvious that the same may be varied in many ways. The description of the invention hereinbefore uses these examples, including the best mode, to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims. Such variations are not to be regarded as a departure from the spirit and scope of the present invention, and all such modifications are intended to be included within the scope of the present invention as stated in the following claims.

The invention claimed is:

1. A pixellated radiation detector module, comprising:
a package or module substrate;
a pixellated radiation detector on the substrate, said pixilated radiation detector comprising a plurality of radiation detector pixels arranged in a grid pattern; and
a readout ASIC in communication with the pixellated radiation detector;
wherein, a symmetrical signal routing array is embedded within the substrate to connect each pixel of the pixellated radiation detector to one readout channel within the readout ASIC, and
the readout channels in the ASIC are divided into at least two symmetrical groups, the signal routing array is formed of communication channels configured to connect neighboring pixels of the plurality of radiation detector pixels to a different group of the at least two symmetrical readout channels.

2. The radiation detecting pixel array of claim 1, wherein the substrate is comprised of a ceramic, plastic, Teflon®, or an insulator.

3. The radiation detecting pixel array of claim 1, wherein the pixellated radiation detector is comprised of a Cadmium Telluride (CdTe/CZT) semiconductor material or a semiconductor material.

4. The radiation detecting pixel array of claim 1, wherein the plurality of radiation detecting pixels are configured to detect gamma radiation.

5. The radiation detecting pixel array of claim 1, wherein the symmetrical signal routing array is embedded beneath the plurality of radiation detecting pixels in a grid pattern matching the grid pattern of the plurality of radiation detecting pixels.

6. The radiation detecting pixel array of claim 1, wherein the signal routing array is embedded beneath the plurality of radiation detecting pixels in a grid pattern configured to provide signal communication between neighboring pixels of the plurality of radiation detecting pixels and different sides of the grid pattern in response to a radiation interaction event.

7. The radiation detecting pixel array of claim 1, wherein the signal routing array is embedded beneath the plurality of radiation detecting pixels in a grid pattern configured to provide signal communication between neighboring pixels of the plurality of radiation detecting pixels and a different channel of each of the at least two symmetrical communication channels in response to a radiation interaction event.

8. The radiation detecting pixel array of claim 1, wherein the at least two communication channels are in operative communication with a plurality of analog-to-digital converters (ADC).

9. The radiation detecting pixel array of claim 1, wherein the at least two communication channels are in operative communication with a radiation detection module.

10. The radiation detecting pixel array of claim 9, wherein the radiation detection module includes an ASIC chip architecture configured to process anode signals from any of the plurality of radiation detecting pixels in response to a radiation interaction event.

11. The radiation detecting pixel array of claim 9, wherein the radiation detecting module is in operative communication with an output device.

12. The radiation detecting pixel array of claim 11, wherein the output device is a display device, an audio device, or a computer.

13. The radiation detecting pixel array of claim 11, wherein the output device is configured to output the direction, flux, energy, and isotope of detected radiation in response to a radiation interaction event.

14. The radiation detecting pixel array of claim 11, wherein the output device is configure to provide one of the direction, flux, energy, and isotope of detected radiation in response to a radiation interaction event.

15. A radiation detecting apparatus, comprising:
a radiation detecting pixel array comprising a plurality of radiation detecting pixels arranged in a grid pattern;
a radiation detector module in operative communication with the radiation detecting pixel array through at least two symmetrical communication channels; and
an output device in operative communication with the radiation detector module; wherein:
the at least two symmetrical communications channels are arranged on each of two sides of the radiation detecting pixel array; and
the at least two symmetrical communication channels are configured to provide anode pixel signals from any pixel of the radiation detecting pixel array to the radiation detector module.

16. The radiation detecting apparatus of claim 15, wherein the radiation detecting pixel array includes:

a package or module substrate;

a pixellated radiation detector on the substrate; and a readout ASIC in communication with the pixellated radiation detector;

wherein, a symmetrical signal routing array is embedded within the substrate to connect each pixel of the pixellated radiation detector to one readout channel within the readout ASIC, and the readout channels in the ASIC are divided into at least two symmetrical groups, the signal routing array is formed of communication channels configured to connect neighboring pixels of the plurality of radiation detector pixels to a different group of the at least two symmetrical readout channels.

17. The radiation detecting apparatus of claim 16, wherein the radiation detection module includes an ASIC chip architecture configured to process anode signals from any of the plurality of radiation detecting pixels in response to a radiation interaction event.

18. The radiation detecting apparatus of claim 16, wherein the signal routing array is embedded beneath the plurality of radiation detecting pixels in a grid pattern configured to provide signal communication between neighboring pixels of the plurality of radiation detecting pixels and a different channel of each of the at least two symmetrical communication channels in response to a radiation interaction event.

19. The radiation detecting apparatus of claim 16, wherein the radiation detecting module is in operative communication with an output device;

the output device is a display device; and the output device is configured to output the direction, flux, energy, and isotope of detected radiation in response to a radiation interaction event.

* * * * *